US009335357B2

(12) United States Patent
Washiro

(10) Patent No.: US 9,335,357 B2
(45) Date of Patent: May 10, 2016

(54) DETECTING DEVICE AND DETECTING METHOD

(75) Inventor: Takanori Washiro, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 71 days.

(21) Appl. No.: 14/003,311

(22) PCT Filed: Mar. 9, 2012

(86) PCT No.: PCT/JP2012/056081
§ 371 (c)(1),
(2), (4) Date: Sep. 5, 2013

(87) PCT Pub. No.: WO2012/128067
PCT Pub. Date: Sep. 27, 2012

(65) Prior Publication Data
US 2013/0335105 A1    Dec. 19, 2013

(30) Foreign Application Priority Data
Mar. 18, 2011 (JP) .................................. 2011-060650

(51) Int. Cl.
*G01R 27/28* (2006.01)
*G01R 27/26* (2006.01)
(Continued)

(52) U.S. Cl.
CPC ............ *G01R 27/2611* (2013.01); *H04B 3/546* (2013.01); *H04B 3/56* (2013.01); *G01R 19/2513* (2013.01); *H04B 2203/5433* (2013.01);
(Continued)

(58) Field of Classification Search
CPC ........... G01R 27/2611; G01R 19/2513; G01R 19/0092; G01R 21/00; H04B 3/546; H04B 3/56; H04B 2203/5433; H04B 2203/5454; H04B 2203/5491

USPC .......................................... 324/654, 649, 600
See application file for complete search history.

(56) References Cited

U.S. PATENT DOCUMENTS 6,930,410 B2 *  8/2005  Ikeda et al. .................... 307/140
7,002,264 B2 *  2/2006  Logan ............................ 307/115
(Continued)

FOREIGN PATENT DOCUMENTS

JP        3-119298        12/1991
JP        11-288315 A     10/1999
(Continued)

OTHER PUBLICATIONS

U.S. Appl. No. 13/592,518, filed Aug. 23, 2012, Washiro.
(Continued)

*Primary Examiner* — Hoai-An D Nguyen
(74) *Attorney, Agent, or Firm* — Hazuki International, LLC

(57) ABSTRACT

Various aspects of a detecting method and a detecting device to detect a state change of power lines are disclosed herein. The detecting device includes a plurality of storage elements, a communication unit and a detection unit. The plurality of storage elements are disposed on power lines and generates a driving power by load-modulating an alternating-current signal communicated through the power lines. The plurality of storage elements further outputs stored first identification information of a plurality of outlets through the power lines. The communication unit receives the first identification information of the plurality of outlets output by the plurality of storage element through the power lines. The detection unit detects change in states of the power lines on the basis of the first identification information of the plurality of outlets.

8 Claims, 8 Drawing Sheets

(51) Int. Cl.
*H04B 3/54* (2006.01)
*H04B 3/56* (2006.01)
*G01R 19/25* (2006.01)

(52) U.S. Cl.
CPC . *H04B2203/5454* (2013.01); *H04B 2203/5491* (2013.01)

(56) References Cited

U.S. PATENT DOCUMENTS

| | | | |
|---|---|---|---|
| 7,268,294 B2* | 9/2007 | Ohkawa et al. | 174/53 |
| 7,501,913 B2 | 3/2009 | Hanada et al. | |
| 8,036,233 B2 | 10/2011 | Yokomitsu et al. | |
| 8,519,560 B2 | 8/2013 | Ito | |
| 8,674,823 B1* | 3/2014 | Contario et al. | 340/538 |
| 8,713,342 B2* | 4/2014 | Holovacs et al. | 713/340 |
| 2004/0082203 A1 | 4/2004 | Logvinov et al. | |
| 2004/0223275 A1 | 11/2004 | Yanagida et al. | |
| 2005/0063355 A1 | 3/2005 | Iwamura | |
| 2006/0087322 A1* | 4/2006 | McCollough, Jr. | 324/500 |
| 2006/0132299 A1 | 6/2006 | Mansfield et al. | |
| 2007/0091925 A1 | 4/2007 | Miyazaki et al. | |
| 2007/0120953 A1 | 5/2007 | Koga et al. | |
| 2007/0149258 A1 | 6/2007 | Tokunaga | |
| 2007/0177407 A1* | 8/2007 | Bruckmann | H02M 5/458 363/8 |
| 2008/0077336 A1* | 3/2008 | Fernandes | 702/57 |
| 2008/0106425 A1* | 5/2008 | Deaver et al. | 340/646 |
| 2008/0107134 A1 | 5/2008 | Okazaki et al. | |
| 2008/0258563 A1* | 10/2008 | Hodges | 307/112 |
| 2009/0263999 A1* | 10/2009 | Onoue | H01R 13/713 439/215 |
| 2009/0278492 A1* | 11/2009 | Shimizu | B60L 11/1816 320/108 |
| 2010/0026087 A1 | 2/2010 | Morita et al. | |
| 2010/0027599 A1 | 2/2010 | Di Chiro et al. | |
| 2010/0136911 A1 | 6/2010 | Sekita et al. | |
| 2010/0194529 A1 | 8/2010 | Yamamoto | |
| 2010/0315197 A1 | 12/2010 | Solomon et al. | |
| 2011/0022222 A1 | 1/2011 | Tonegawa | |
| 2011/0047188 A1 | 2/2011 | Martins et al. | |
| 2011/0133552 A1 | 6/2011 | Binder et al. | |
| 2011/0156642 A1 | 6/2011 | Noguchi et al. | |
| 2011/0286534 A1 | 11/2011 | Hatakeyama | |
| 2011/0309916 A1 | 12/2011 | Mueller et al. | |
| 2012/0092141 A1 | 4/2012 | Ichihara et al. | |
| 2012/0217928 A1 | 8/2012 | Kulidjian et al. | |
| 2012/0268973 A1 | 10/2012 | Tsai et al. | |
| 2012/0300860 A1* | 11/2012 | Washiro | 375/257 |
| 2012/0306661 A1* | 12/2012 | Xue | G05B 19/042 340/870.02 |
| 2013/0063255 A1* | 3/2013 | Washiro | 340/12.32 |
| 2013/0065552 A1 | 3/2013 | Soma et al. | |
| 2013/0275779 A1* | 10/2013 | He | G06F 1/266 713/300 |
| 2015/0316592 A1* | 11/2015 | Minezawa | H02J 13/0013 324/600 |

FOREIGN PATENT DOCUMENTS

| | | |
|---|---|---|
| JP | 3289320 B2 | 6/2002 |
| JP | 2003-078458 A | 3/2003 |
| JP | 2003-110471 A | 4/2003 |
| JP | 2006-072815 A | 3/2006 |
| JP | 2008-306840 A | 12/2008 |
| JP | 2010-055845 A | 3/2010 |

OTHER PUBLICATIONS

U.S. Appl. No. 13/604,863, filed Sep. 6, 2012, Soma et al.

\* cited by examiner

DETECTING DEVICE AND DETECTING METHOD

TECHNICAL FIELD

The present disclosure relates to a detecting device and a detecting method and more particularly, to a detecting device and a detecting method that enable states of power lines to be detected.

BACKGROUND ART

In the related art, technology for incorporating an IC chip storing identification information and the like in an electronic device and communicating the identification information and the like stored in the IC chip of the electronic device between the electronic device and a reader/writer, through power lines supplying driving power to the electronic device, exists.

Specifically, the identification information and the like are communicated by load-modulating a high frequency signal corresponding to a carrier communicated through the power lines, according to the identification information and the like (for example, refer to Patent Document 1).

CITATION LIST

Patent Document

Patent Document 1: Japanese Patent No. 3289320

SUMMARY OF THE INVENTION

Problems to be Solved by the Invention

According to the technology described above, the electronic device that is connected to the power lines can be identified.

It has been requested to establish technology for further applying the technology described above and detecting a state change of the power lines with a simple circuit configuration, such that connection of an outlet plug of the electronic device to an outlet provided on the power lines is detected and the electronic device is identified or disconnection and the like are detected.

The present disclosure has been made in view of the above circumstances and enables a state change of power lines to be detected with a simple circuit configuration.

Solutions to Problems

A detecting device of one aspect of the present disclosure includes: a first storage element that is disposed on power lines, generates driving power on the basis of an alternating-current signal communicated through the power lines, load-modulates the alternating-current signal communicated through the power lines, and outputs stored first identification information through the power lines; a communication unit that receives the first identification information output by the first storage element through the power lines; and a detecting unit that detects states of the power lines on the basis of the received first identification information.

The detecting unit can detect that an electronic device is connected to the power lines and disconnection is generated in the power lines, on the basis of the received first identification information.

The detecting device of one aspect of the present disclosure can further include a plurality of outlets that feed power to the electronic device, a plurality of first storage elements is connected in parallel to one of positive and negative sides of the power lines connected to the plurality of outlets and output the stored first identification information through the power lines, when the electronic device is connected to the outlet and the power lines become a closed circuit, and the detecting unit can detect that the electronic device is connected to the outlet, on the basis of reception of the first identification information.

The communication unit can receive second identification information output by a second storage element, which is incorporated in the electronic device connected to the power lines and is configured equally to the first storage element, through the power lines, and the detecting unit can associate the received first identification information and second identification information with each other and manage the identification information.

The detecting device of one aspect of the present disclosure can further include a switching unit that performs switching such that one of the plurality of first storage elements corresponding to the plurality of outlets is connected to the communication unit.

The detecting device of one aspect of the present disclosure can further include a providing unit that provides the states of the power lines detected by the detecting unit to a user.

The storage element is connected to positive and negative sides of the power lines and regularly outputs the stored identification information through the power lines, and the detecting unit can detect that the disconnection is generated in the power lines, on the basis of non-reception of the identification information.

The detecting device of one aspect of the present disclosure can further include a blocking unit that is provided on the power lines and blocks an input/output of the alternating-current signal.

A detecting method of one aspect of the present disclosure is a detecting method of a detecting device that includes a first storage element which is disposed on power lines, generates driving power on the basis of an alternating-current signal communicated through the power lines, load-modulates the alternating-current signal communicated through the power lines, and outputs stored first identification information through the power lines and detects states of the power lines, and the detecting method includes: a communication step of causing the detecting device to receive the first identification information output by the first storage element through the power lines; and a detection step of causing the detecting device to detect the states of the power lines on the basis of the received first identification information.

In one aspect of the present disclosure, the first identification information output by the first storage element is received through the power lines and the states of the power lines are detected on the basis of the received first identification information.

Effects of the Invention

According to one aspect of the present disclosure, a state change of power lines can be detected.

MODE FOR CARRYING OUT THE INVENTION

Hereinafter, modes for carrying out the invention (hereinafter, referred to as embodiments) will be described.

1. First Embodiment

External Appearance of Table Tap

Figure 1:
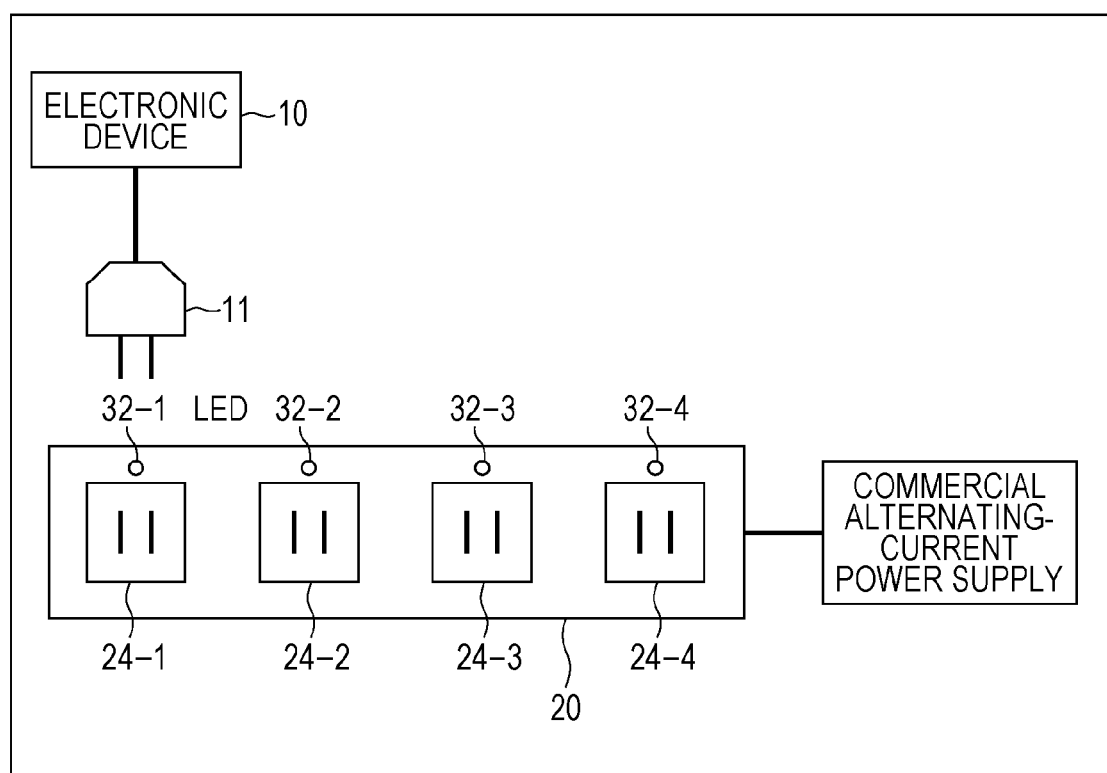
FIG. 1 is an external view of a table tap to be a first embodiment.

FIG. 1 shows an external view of a table tap to be a first embodiment.

A table tap 20 has a plurality of outlets 24 (in the case of FIG. 1, four outlets 24-1 to 24-4) that are provided on a top surface of a casing thereof. In addition, a plurality of LEDs 32 that provide states of the outlets 24 to a user are provided on the top surface of the casing to correspond to the outlets 24. Alternating-current power is input from a commercial alternating-current power supply to the table tap 20.

The table tap 20 identifies an electronic device 10 (which an outlet plug 11 is inserted into) that is connected to the outlets 24-1 to 24-4. In addition, the table tap 20 feeds the alternating-current power from the commercial alternating-current power supply to the electronic device 10 connected to the outlet 24.

[First Configuration Example of Table Tap 20]

Figure 2:
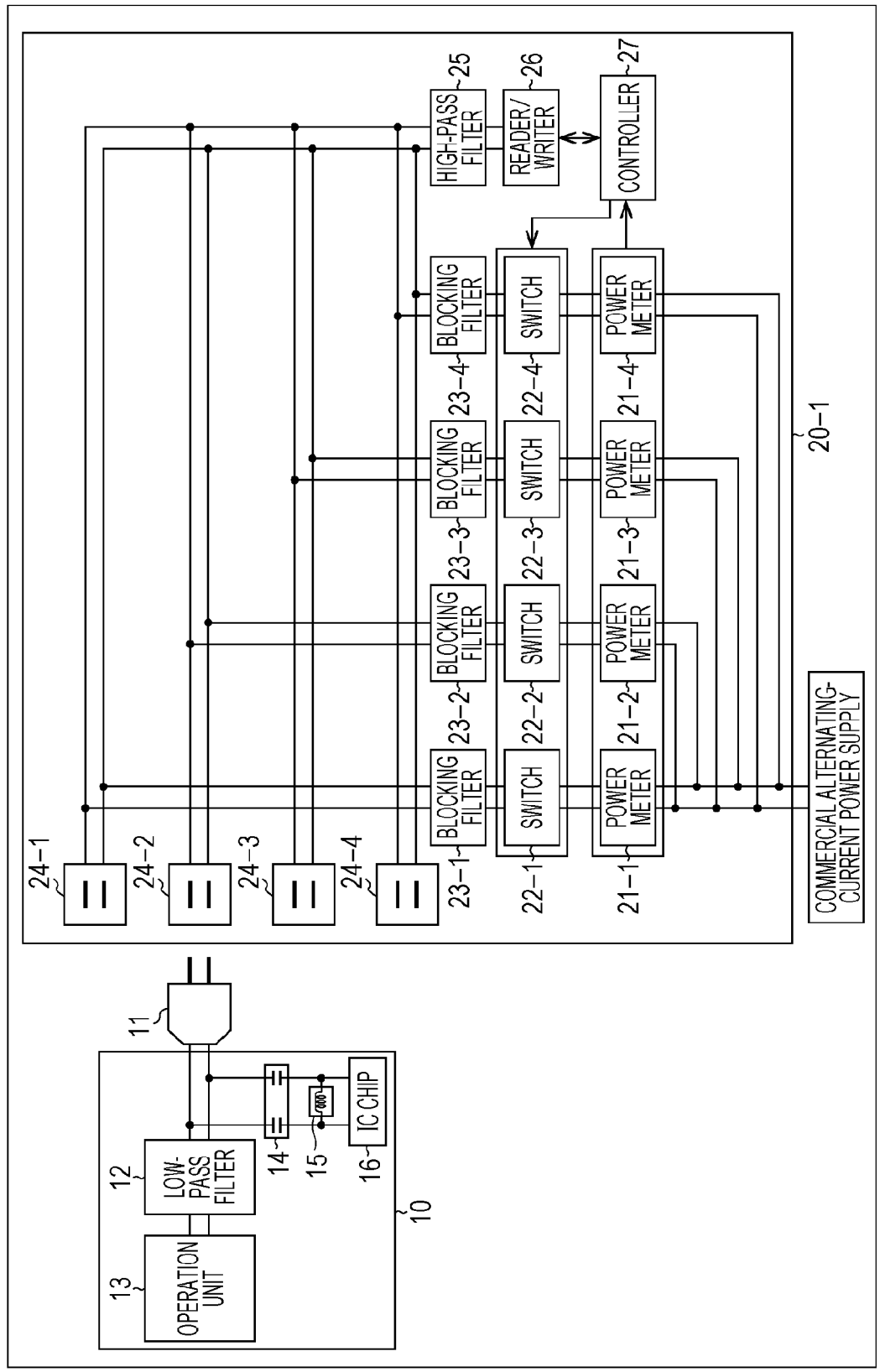
FIG. 2 is a block diagram showing a first configuration example of a table tap.

FIG. 2 shows a configuration example of the electronic device 10 and a first configuration example of the table tap 20.

The electronic device 10 includes an outlet plug 11, a low-pass filter 12, an operation unit 13, a high-pass filter 14, a voltage generating unit 15, and an IC chip 16.

The outlet plug 11 is inserted into the outlet 24 of the table tap 20 and is connected to power lines in the table tap 20. The low-pass filter 12 supplies the alternating-current power input from the table tap 20 through the outlet plug 11 to the operation unit 13 and prevents an alternating-current signal communicated through the power lines between the IC chip 16 and a reader/writer 26 of the table tap 20 from being input to the operation unit 13.

The operation unit 13 uses the alternating-current power input through the outlet plug 11 and the low-pass filter 12 as driving power and executes predetermined processing. The high-pass filter 14 prevents the alternating-current power from the outlet plug 11 from being input to the IC chip 16, while passing the alternating-current signal communicated through the power lines between the IC chip 16 and the reader/writer 26 of the table tap 20.

The voltage generating unit 15 is configured using, for example, a coil and generates a voltage to drive the IC chip 16, on the basis of the alternating-current signal transmitted from the reader/writer 26 through the power lines.

The IC chip 16 holds identification information (hereinafter, referred to as a device ID) of the electronic device 10, load-modulates the alternating-current signal transmitted from the reader/writer 26 through the power lines, according to the held device ID, and transmits the device ID to the reader/writer 26.

Figure 3:
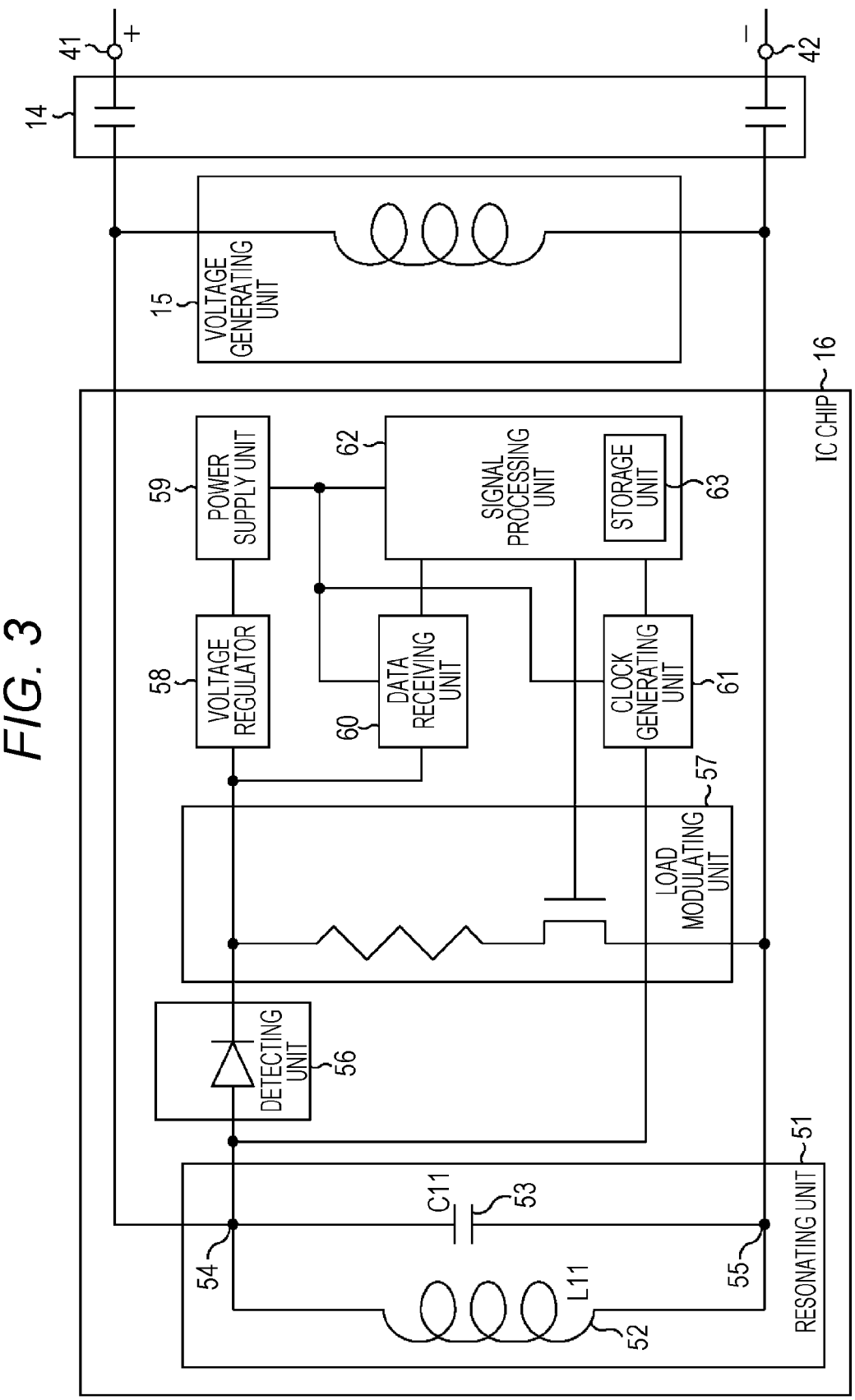
FIG. 3 is a block diagram showing a configuration example of an IC chip.

FIG. 3 shows a detailed configuration example of the IC chip 16. The IC chip 16 that functions as a storage element can be configured using an IC chip based on various standards and an electronic tag such as a tag. For example, electronic tags that are based on standards such as RFID (Radio Frequency Identification), Mifare, FeliCa, and NFC (Near Field Communication) (all of them are trademarks) and electronic tags that are not based on the standards and have independent configurations can be prepared. The storage element preferably has at least a function of reading and outputting the device ID of the electronic device 10 stored therein by the alternating-current signal and a function of storing information supplied from the reader/writer 26. The storage element may be of any type of a passive type and an active type.

The IC chip 16 includes a resonating unit 51, a detecting unit 56, a load modulating unit 57, a voltage regulator 58, a power supply unit 59, a data receiving unit 60, a clock generating unit 61, and a signal processing unit 62.

In the resonating unit 51, a coil 52 that has self-inductance of L11 and a capacitor 53 that has a capacity of C11 constitute a parallel resonance circuit. One connection point of the coil 52 and the capacitor 53 is a positive voltage supply point 54 and the other connection point is a negative voltage supply point 55. Values of the self-inductance L11 and the capacity C11 are set such that a resonance frequency is 13.56 MHz. That is, the resonating unit 51 that has the coil 52 functions as an antenna when an alternating-current signal having a frequency f=13.56 MHz is wirelessly communicated and has a function of generating an induced voltage of an alternating current by electromagnetic induction.

However, in the case of this embodiment, the alternating-current signal that has the frequency f=13.56 MHz is not wirelessly communicated and is supplied from the reader/writer 26 by wire (power lines). Therefore, the resonating unit 51 or at least the coil 52 of the resonating unit 51 may be omitted. Thereby, an erroneous operation is suppressed from being generated due to an influence from a surrounding metal. In this case, the alternating-current signal that is input from the reader/writer 26 through the power lines is input directly to the detecting unit 56. In the case in which the resonating unit 51 is not omitted, if the alternating-current signal having the frequency f=13.56 MHz is input, the resonating unit 51 resonates to the alternating-current signal and generates a voltage from the voltage supply points 54 and 84.

The detecting unit 56 is configured using, for example, a diode. The detecting unit 56 rectifies an alternating-current induced voltage from the positive voltage supply point 54 with a direct-current induced voltage and demodulates a signal included in the alternating-current signal (carrier) transmitted from the reader/writer 26. The load modulating unit 57 is configured using a resistor and an FET (Field Effect Transistor). The FET that functions as a switching element may be of a p channel type or an n channel type. As the FET, a bipolar transistor can be used.

The voltage regulator 58 smoothes the voltage rectified by the detecting unit 56, converts the voltage into a constant voltage, and supplies the voltage to the power supply unit 59. The power supply unit 59 distributes generated power to the data receiving unit 60, the clock generating unit 61, and the signal processing unit 62.

The data receiving unit 60 extracts (amplitude demodulation) a low frequency component from a half-wave rectification voltage output by the detecting unit 56, amplifies the low frequency component, generates a binarized data signal of a high level and a low level, and supplies the binarized data signal to the signal processing unit 62. The clock generating unit 61 generates a rectangular clock signal from the alternating-current signal supplied from the voltage supply point 54 and supplies the clock signal to the signal processing unit 62.

The signal processing unit 62 reads the data signal in synchronization with the clock signal. In addition, the signal processing unit 62 generates a binarized response signal of a high level and a low level, on the basis of the device ID stored in an incorporated storage unit 63, and outputs the response signal to a gate of the FET of the load modulating unit 57. The FET is turned on or off by the response signal. Thereby, the load modulation to change the impedance from the voltage supply points 54 and 84 is performed. That is, the alternating-current signal that is load-modulated by the device ID of the electronic device 10 is transmitted to the reader/writer 26 through the power lines.

The voltage generating unit 15 that is provided between the voltage supply points 54 and 55 is configured using a coil that has self-inductance of L21. The coil generates a voltage when the alternating-current signal is input from the reader/writer 26 through the power lines. The generated voltage is supplied to the voltage supply points 54 and 55. Therefore, in the IC chip 16, a voltage is generated in both the resonating unit 51 and the voltage generating unit 15.

Returning to FIG. 2, the first configuration example (hereinafter, referred to as a table tap 20-1) of the table tap 20 has the plurality of outlets 24 (in the case of FIG. 1, the four outlets 24-1 to 24-4) and a power meter 21-*i*, a switch 22-*i*, and a blocking filter 23-*i* are provided in series to correspond to an outlet 24-*i* (i=1, 2, 3, and 4).

The power meter 21-*i* measures power supplied to the electronic device 10 through the outlet 24-*i*. A controller 27 is notified of a measurement result in the power meter 21-*i*. The switch 22-*i* is switched to ON or OFF according to control from the controller 27. When the switch 22-*i* is switched to ON, the switch 22-*i* outputs the alternating-current power input from the power meter 11-*i* to the blocking filter 23. The blocking filter 23-*i* outputs the alternating-current power input from the switch 22-*i* to the outlet 24-*i* and prevents the alternating-current signal communicated through the power lines between the reader/writer 26 and IC chip 16 of the electronic device 10 from being input to the switch 22-*i*.

The table tap 20-1 further has a high-pass filter 25, the reader/writer 26, and the controller 27.

The high-pass filter 25 prevents the alternating-current power from being input to the reader/writer 26 and the controller 27, while passing the alternating-current signal communicated through the power lines between the reader/writer 26 and the IC chip 16 of the electronic device 10. The reader/writer 26 communicates the alternating-current signal through the power lines, between the IC chip 16 of the electronic device 10 and the reader/writer 26.

Specifically, the reader/writer 26 generates a command with respect to the IC chip 16, modulates the carrier by the generated command, and outputs the carrier as the alternating-current signal to the power lines. As the carrier, for example, a high frequency signal (also referred to as an RF signal) having a frequency f of 13.56 MHz is used. The frequency f of the alternating-current signal is not limited to 13.56 MHz and any frequency may be used as the frequency f. The reader/writer 26 demodulates a reflection wave of the alternating-current signal obtained by load-modulating the carrier by the IC chip 16 on the basis of the device ID of the electronic device 10 and outputs the device ID obtained as a demodulation result to the controller 27.

The controller 27 holds a supply power amount measured by the power meter 21-*i*, to correspond to the device ID of the electronic device 10 connected to the outlet 24-*i*, which is to be input from the reader/writer 26. Held information is used for request of power rates for a user of the electronic device 10. In addition, the controller 27 controls the switch 22-*i* on the basis of the device ID of the electronic device 10 connected to the outlet 24-*i*, which is to be input from the reader/writer 26. Specifically, the controller 27 determines whether the device ID of the electronic device 10 connected to the outlet 24-*i* is previously registered. When the device ID is not previously registered, the controller 27 switches the switch 22-*i* to OFF and stops feeding with respect to the electronic device 10.

The alternating-current power functioning as driving power of each component of the table tap 20-1 is fed to each component of the table tap 20-1 by power lines not illustrated in the drawings.

According to the table tap 20-1, connection of the electronic device 10 to any one of the outlets 24-1 to 24-4 can be detected and the device ID of the electronic device 10 can be acquired. However, it cannot be specified which of the outlets 24-1 to 24-4 the electronic device 10 is connected to.

Therefore, next, a configuration example of the table tap 20 that can determine which of the outlets 24-1 to 24-4 the electronic device 10 is connected to will be described.

[Second Configuration Example of Table Tap 20]

Figure 4:
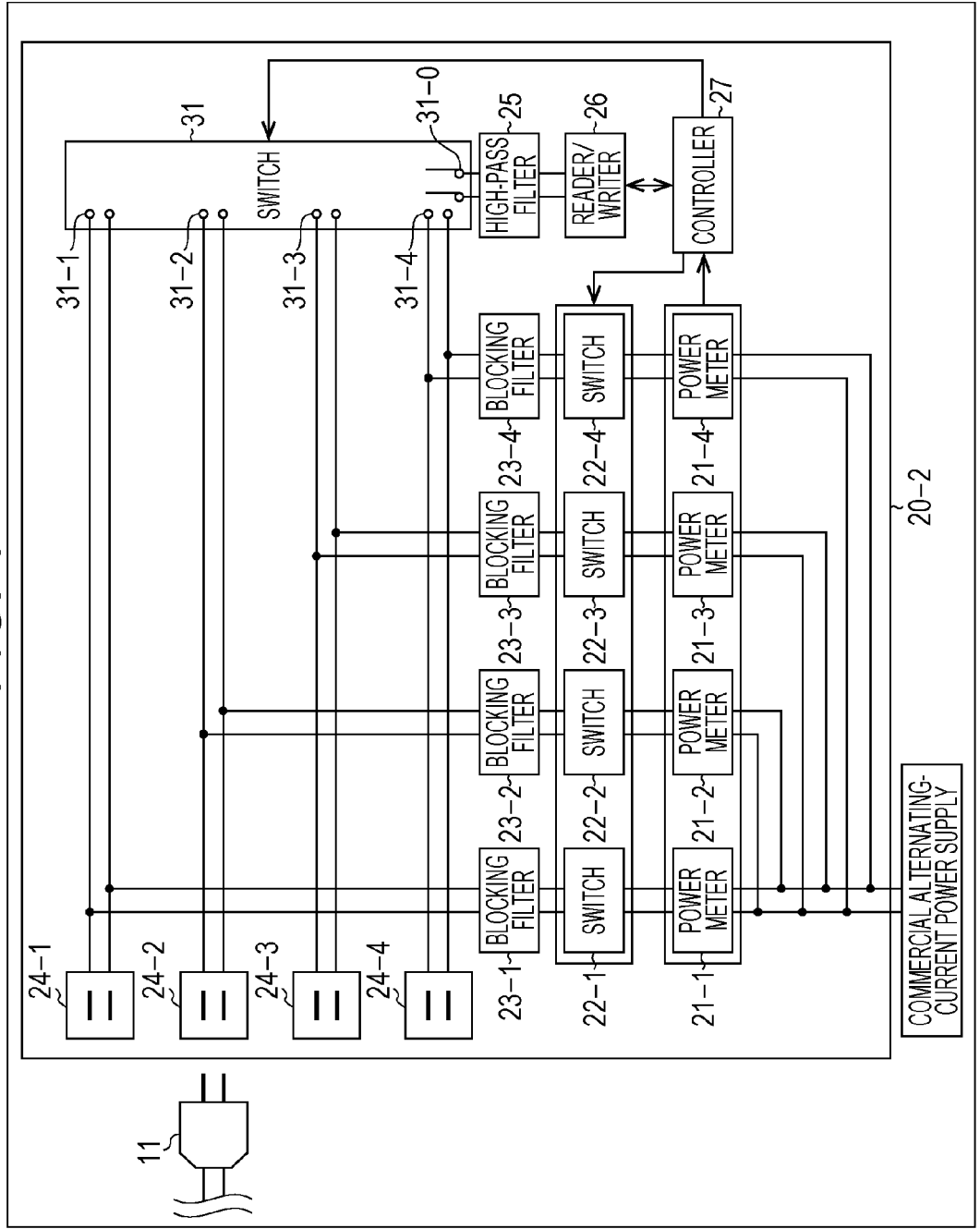
FIG. 4 is a block diagram showing a second configuration example of a table tap.

FIG. 4 shows a second configuration example of the table tap 20. The second configuration example (hereinafter, referred to as a table tap 20-2) of the table tap 20 is configured by adding a switch 31 to the table tap 20-1 shown in FIG. 2. The table tap 20-2 can determine which of the outlets 24-1 to 24-4 the electronic device 10 is connected to and acquire the device ID of the electronic device. Because components other than the switch 31 are equal to the components of the table tap 20-1 and are denoted by the same reference numerals, the description thereof will be omitted.

The switch 31 has terminals 31-0, 31-1, 31-2, 31-3, and 31-4. The terminal 31-0 is connected to the high-pass filter 25. The terminal 31-1 is connected to power lines connected to the outlet 24-1, the terminal 31-2 is connected to power lines connected to the outlet 24-1, the terminal 31-3 is connected to power lines connected to the outlet 24-1, and the terminal 31-4 is connected to power lines connected to the outlet 24-1. In addition, the switch 31 operates such that the terminal 31-0 is sequentially connected to the terminals 31-1 to 31-4, according to the control from the controller 27.

According to the table tap 20-2, when the device ID is received from the electronic device 10, it can be determined which of the outlets 24-1 to 24-4 the electronic device 10 is connected to by determining which of the terminals 31-1 to 31-4 the terminal 31-0 of the switch 31 is connected to and the device ID of the electronic device can be acquired.

However, if the electronic device 10 is connected to the outlet 24-1 at timing when the terminal 31-0 of the switch 31 is connected to the terminal 31-2, connection of the electronic device 10 cannot be determined, until the terminal 31-0 is connected to the terminal 31-1. This is applicable to the case in which the plurality of electronic devices 10 is connected to the plurality of outlets 24, respectively. That is, in the table tap 20-2, delay may be generated until connection of the electronic device 10 is detected.

Therefore, next, a configuration example of the table tap 20 that can determine which of the outlets 24-1 to 24-4 the electronic device 10 is connected to in real time will be described.

[Third Configuration Example of Table Tap 20]

Figure 5:
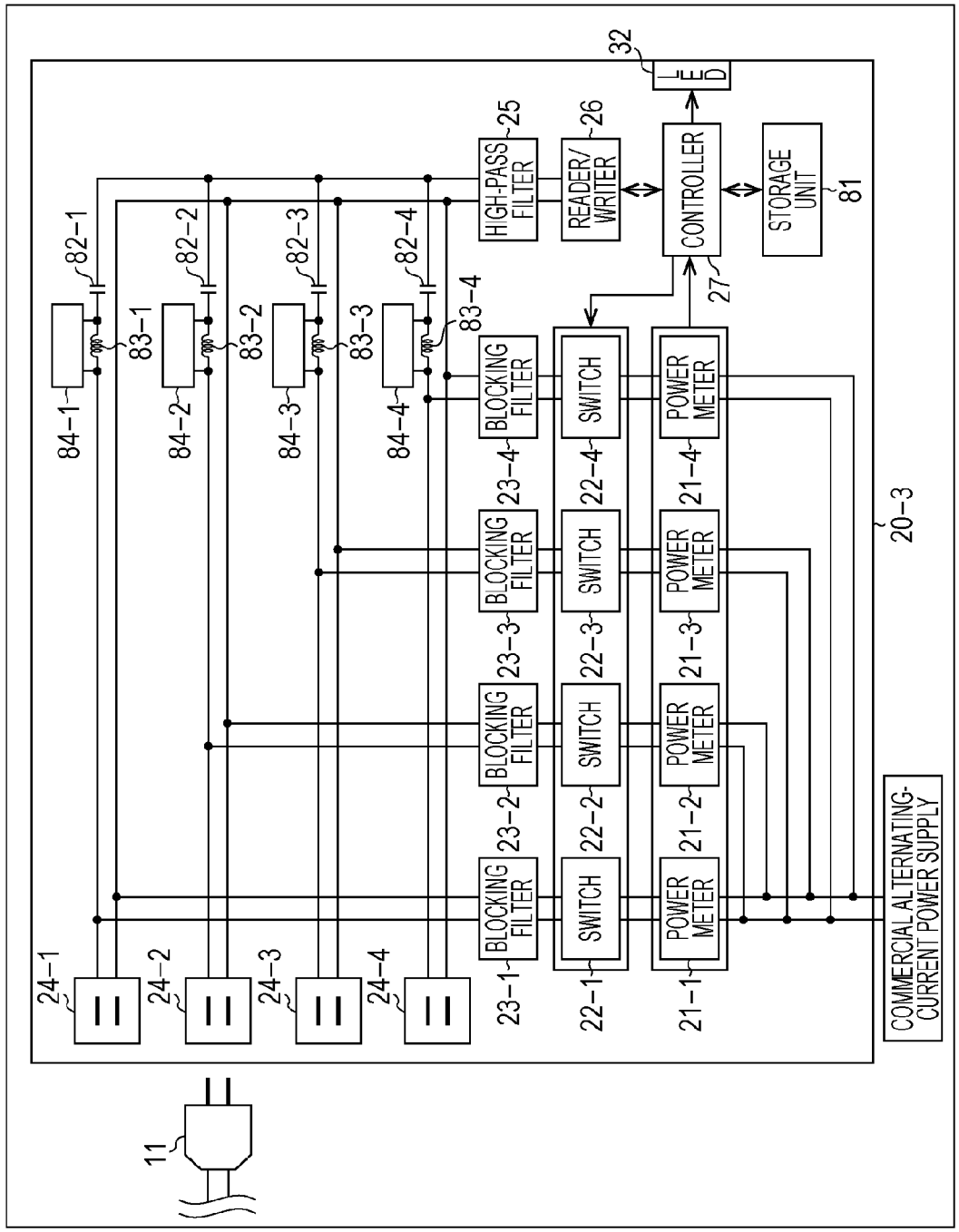
FIG. 5 is a block diagram showing a third configuration example of a table tap.

FIG. 5 shows a third configuration example of the table tap 20. The third configuration example (hereinafter, referred to as a table tap 20-3) of the table tap 20 is configured by adding an LED 32 and a storage unit 81 to the table tap 20-1 shown in FIG. 2. In the table tap 20-3, a capacitor 82-$i$ and a coil 83-$i$ that are connected in series to one of positive and negative power lines connected to the outlet 24-$i$ and an IC chip 84-$i$ that is connected in parallel to one of the positive and negative power lines are additionally provided. Because components of the table tap are equal to the components of the table taps 20-1 and 20-2 and are denoted by the same reference numerals, the description thereof will be omitted.

The storage unit 81 associates outlet IDs to distinguish the outlets 24-1 to 24-4 with the device IDs of the connected electronic devices 10 and stores an association result, according to the control from the controller 27. When the electronic devices 10 are disconnected from the outlets 24-1 to 24-4, storage information of the corresponding storage unit 81 is erased.

In the capacitor 82-$i$ and the coil 83-$i$ that are connected in series to the power lines, a capacity C and self-inductance L is set to form a series resonance circuit with respect to the frequency f of the alternating-current signal, that is, satisfy $2\pi f = 1/\sqrt{(L \cdot C)}$.

The IC chip 84-$i$ that is connected in parallel to one of the positive and negative power lines is configured as shown in FIG. 3, similar to the IC chip 16 of the electronic device 10. However, an outlet IDi that is identification information of the corresponding outlet 24-$i$ is held in the IC chip 84-$i$. Therefore, when the electronic device 10 is connected to the corresponding outlet 24-$i$ and the power lines become a closed circuit, the IC chip 84-$i$ returns an outlet ID according to the command based on the alternating-current signal from the reader/writer 26 (load-modulates the alternating-current signal by the outlet ID). When the electronic device 10 is not connected to the corresponding outlet 24-$i$, the power lines become an open circuit. For this reason, the IC chip 84-$i$ does not receive the alternating-current signal from the reader/writer 26 and does not return the outlet ID.

For example, if an electronic device 10A is connected to the outlet 24-1, the IC chip 16 of the electronic device 10A notifies the reader/writer 26 of a device IDA and the IC chip 84-1 in the table tap 20-3 notifies the reader/writer 26 of an outlet ID1. If the reader/writer 26 notifies the controller 27 of the device IDA of the electronic device 10A and the outlet ID1 that have been received, the controller 27 can determine that the electronic device 10 has been connected to the outlet 24-1 and acquire the device IDA of the connected electronic device 10A. According to the control from the controller 27, the storage unit 81 associates the outlet ID1 showing the outlet 24-1 with the device IDA of the connected electronic device 10A and stores an association result.

For example, if an electronic device 10B is connected to the outlet 24-2 in a state in which the electronic device 10A is connected to the outlet 24-1, the reader/writer 26 is notified of a device IDB and an outlet ID2, in addition to the notified device IDA and outlet ID1. In this case, the controller 27 can determine that the two electronic devices 10A and 10B are connected to the two outlets 24-1 and 24-2, in real time.

However, it cannot be determined which of the electronic devices 10A and 10B is connected to each of the outlets 24-1 and 24-2. In this case, the storage unit 81 is referred to. In the storage unit 81, because the outlet ID1 is already associated with the device IDA, it is determined that the electronic device 10B is connected to the outlet 24-2. In the storage unit 81, the outlet ID2 is associated with the device IDB and an association result is additionally stored.

However, when the electronic device 10B is connected to the outlet 24-2 at the same time as when the electronic device 10A is connected to the outlet 24-1, the reader/writer 26 is notified of the device IDA and the outlet ID1 and the device IDB and the outlet ID2. In this case, the controller 27 can determine that the two electronic devices 10A and 10B are connected to the two outlets 24-1 and 24-2, in real time. However, because there is no information in the storage unit 81, it cannot be determined which of the electronic devices 10A and 10B is connected to each of the outlets 24-1 and 24-2.

In this case, the controller 27 controls the LED 32 and makes LEDs 32-1 and 32-2 corresponding to the outlets 24-1 and 24-2 emit light in a state in which the electronic device 10 is connected and the device ID thereof is not specified (for example, makes the LEDs 32-1 and 32-2 emit light in a red flickering state). If a user who has viewed the light emission inserts or extracts the two outlet plugs 11 connected to the outlets 24-1 and 24-2 at different timing, the reader/writer 26 is notified of the device IDA and the outlet ID=1 and the device IDB and the outlet ID=2 at different timing. Therefore, it is specified which of the electronic devices 10A and 10B is connected to each of the outlets 24-1 and 24-2.

When the device ID of the connected electronic device 10 can be specified by re-insertion of the outlet plug, the LED 32 corresponding to the outlet is made to emit green light, such that the user can accurately recognize which electronic device 10 is connected to which outlet 24.

As described above, according to the table tap 20-3, it can be determined which of the outlets 24-1 to 24-4 the electronic device 10 is connected to, in real time. When the plurality of electronic devices 10 is sequentially connected, the electronic devices 10 that are connected to the outlets 24-1 to 24-4 can be specified.

Next, a configuration example of the table tap 20 that can specify the electronic devices 10 connected to the outlets 24-1 to 24-4 without requiring insertion and extraction of the outlet plug 11 by the user, even when the plurality of electronic devices 10 is connected at the same time, will be described.

[Fourth Configuration Example of Table Tap 20]

Figure 6:
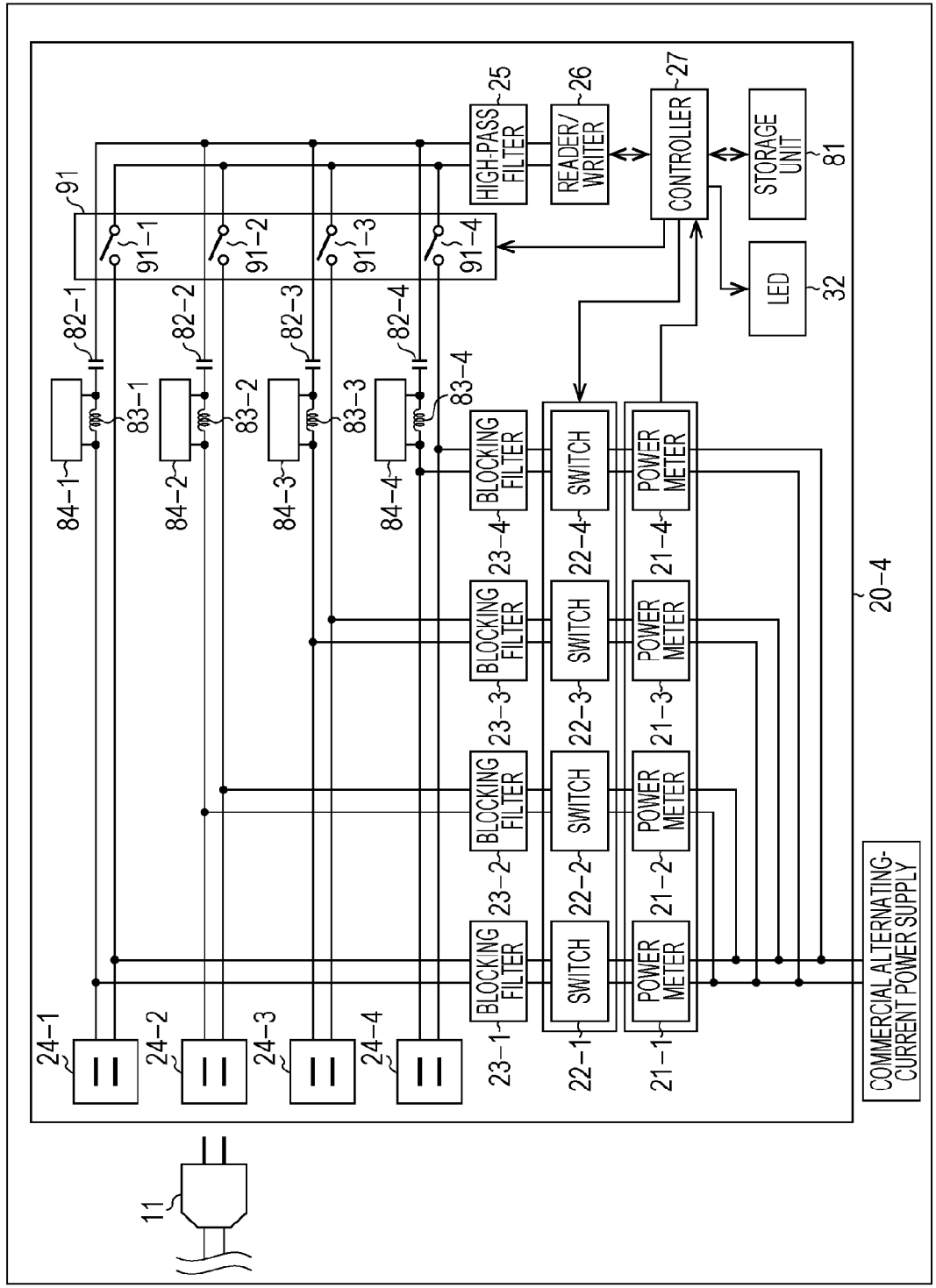
FIG. 6 is a block diagram showing a fourth configuration example of a table tap.

FIG. 6 shows a fourth configuration example of the table tap 20. The fourth configuration example (hereinafter, referred to as a table tap 20-4) of the table tap 20 is configured by adding a switch 91 to the table tap 20-3 shown in FIG. 5. Because components other than the switch 91 are equal to the components of the table tap 20-3 and are denoted by the same reference numerals, the description thereof will be omitted.

The switch 91 includes four switches 91-1 to 91-4 that turn on/off power lines connecting the outlets 24-1 to 24-4 and the reader/writer 26. All of the switches 91-1 to 91-4 are normally turned on. According to the control from the controller 27, only one of the switches corresponding to the outlet 24 to which the electronic device 10 is connected is switched to ON momentarily and the other switches are switched to temporarily OFF from ON and then ON again. That is, the switches 91-1 to 91-4 act for an operation in which the user inserts or extracts the outlet plug 11 according to a light emission state of the LED 32, with respect to the table tap 20-3.

For example, when the electronic device 10B is connected to the outlet 24-2 at the same time as when the electronic device 10A is connected to the outlet 24-1, the reader/writer 26 is notified of the device IDA and the outlet ID1 and the device IDB and the outlet ID2. In this case, the controller 27 can determine that the two electronic devices 10A and 10B are connected to the two outlets 24-1 and 24-2, in real time.

However, because there is no information in the storage unit 81, it cannot be determined which of the electronic devices 10A and 10B is connected to each of the outlets 24-1 and 24-2.

In this case, the controller 27 controls the switch 91-1 (or the switch 91-2) and temporarily turns off the power lines connecting the outlet 24-1 and the reader/writer 26 and then turns on the power lines immediately. Thereby, when the switch 91-1 is turned off, the reader/writer 26 is notified of only the device IDB and the outlet ID2. Therefore, the controller 27 can determine that the electronic device 10B is connected to the outlet 24-2. Then, the controller 27 can determine that the electronic device 10A is connected to the outlet 24-1.

As described above, according to the table tap 20-4, it can be determined which of the outlets 24-1 to 24-4 the electronic device 10 is connected to, in real time. Even when the plurality of electronic devices 10 is connected at the same time, the electronic devices 10 that are connected to the outlets 24-1 to 24-4 can be specified.

[Description of Operation by Table Tap 20-4]

Figure 7:
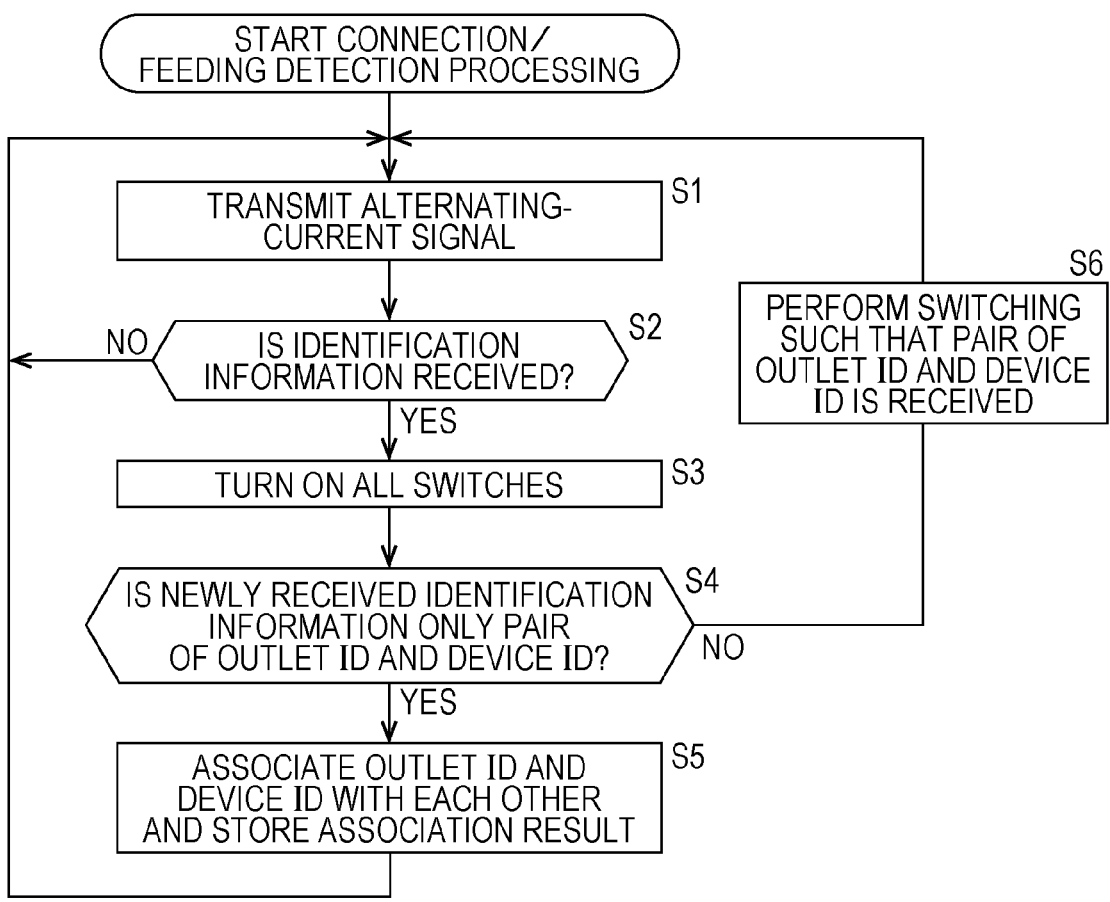
FIG. 7 is a flowchart illustrating connection/feeding detection processing.

Next, FIG. 7 is a flowchart illustrating connection/feeding detection processing by the table tap 20-4.

The connection/feeding detection processing is continuously executed while the alternating-current power is input from the commercial alternating-current power supply to the table tap 20-4. When the connection/feeding detection processing starts, all of the switches 91-1 to 91-4 are switched to ON.

In step S1, the reader/writer 26 transmits an alternating-current signal including a command to request for transmission of identification information, to the IC chip 16 of the electronic device 10 and the IC chip 84-$i$ in the table tap 20-4. In step S2, the reader/writer 26 determines whether the identification information returned according to the transmitted command is received. When it is determined that the identification information is not received, the process returns to step S1 and the following processes are repeated.

If the electronic device 10 is connected to the outlet 24-$i$ of the table tap 20-4, the IC chip 16 of the electronic device 10 notifies the reader/writer 26 of a device ID functioning as the identification information. The IC chip 84-$i$ in the table tap 20-4 notifies the reader/writer 26 of an outlet ID functioning as the identification information.

In step S2, when it is determined that the identification information returned according to the command is received, the received identification information is output to the controller 27 and the process proceeds to step S3. In step S3, if there is the switch that is switched to OFF among the switches 91-1 to 91-4, the controller 27 makes the switch switched to ON.

In step S4, the controller 27 determines whether the identification information received in immediately previous step S2 is only a pair of a device ID and an outlet ID not stored in the storage unit 81.

When it is determined that the received identification information is only the pair of the device ID and the outlet ID not stored in the storage unit 81, the process proceeds to step S5. In step S5, according to the control from the controller 27, the storage unit 81 associates the received outlet ID with the device ID and stores an association result. Then, the process returns to step S1 and the following processes are repeated.

When the outlet ID and the device ID stored in the storage unit 81 are not received, storage information of the association of the outlet ID and the device ID is erased.

In step S4, when the identification information received in immediately previous step S2 is not only the pair of the device ID and the outlet ID not stored in the storage unit 81, that is, plural pairs of outlet IDs and device IDs are received, the process proceeds to step S6.

In step S6, the controller 27 makes only one of the plurality of switches 91-$i$ corresponding to the received plurality of outlet IDs switched to ON momentarily and the other switches switched to OFF, such that only the pair of the device ID and the outlet ID is received at the same time. Then, the process returns to step S1.

For example, in step S2, when two pairs of the pair of the outlet ID1 and the device IDA and the pair of the outlet ID2 and the device IDB not stored in the storage unit 81 are received, only one (for example, the switch 91-1) of the switches 91-1 and 91-2 with respect to the outlets ID1 and ID2 is switched to ON momentarily and the other switch (in this case, the switch 91-2) is switched to OFF. Thereby, in following step S2, only the pair of the outlet ID1 and the device IDA is received. Therefore, connection of the electronic device 10 of the device IDA to the outlet 24-1 can be detected and the outlet ID and the device ID can be stored.

For example, in step S2, when three pairs of the pair of the outlet ID1 and the device IDA, the pair of the outlet ID2 and the device IDB, and a pair of an outlet ID3 and a device IDC not stored in the storage unit 81 are received, only one (for example, the switch 91-1) of the switches 91-1, 91-2, and 91-3 with respect to the outlets ID1, ID2, and ID3 is switched to ON momentarily and the other switches (in this case, the switches 91-2 and 91-3) are switched to OFF. Thereby, in following step S2, only the pair of the outlet ID1 and the device IDA is received. Therefore, connection of the electronic device 10 of the device IDA to the outlet 24-1 can be detected and the outlet ID and the device ID can be stored.

Then, in following step S2, because two pairs of the pair of the outlet ID2 and the device IDB and the pair of the outlet ID3 and the device IDC not stored in the storage unit 81 are received, the processes of steps S1, S2, S3, and S6 are repeated as described above.

The description of the connection/feeding detection processing by the table tap 20-4 ends. According to the connection/feeding detection processing by the table tap 20-4, even when the plurality of electronic devices 10 is connected to the outlets 24-1 to 24-4 at the same time, the electronic devices 10 that are connected to the outlets 24-1 to 24-4 can be specified.

2. Second Embodiment

Configuration Example of Power Line Disconnection Detection System

Figure 8:
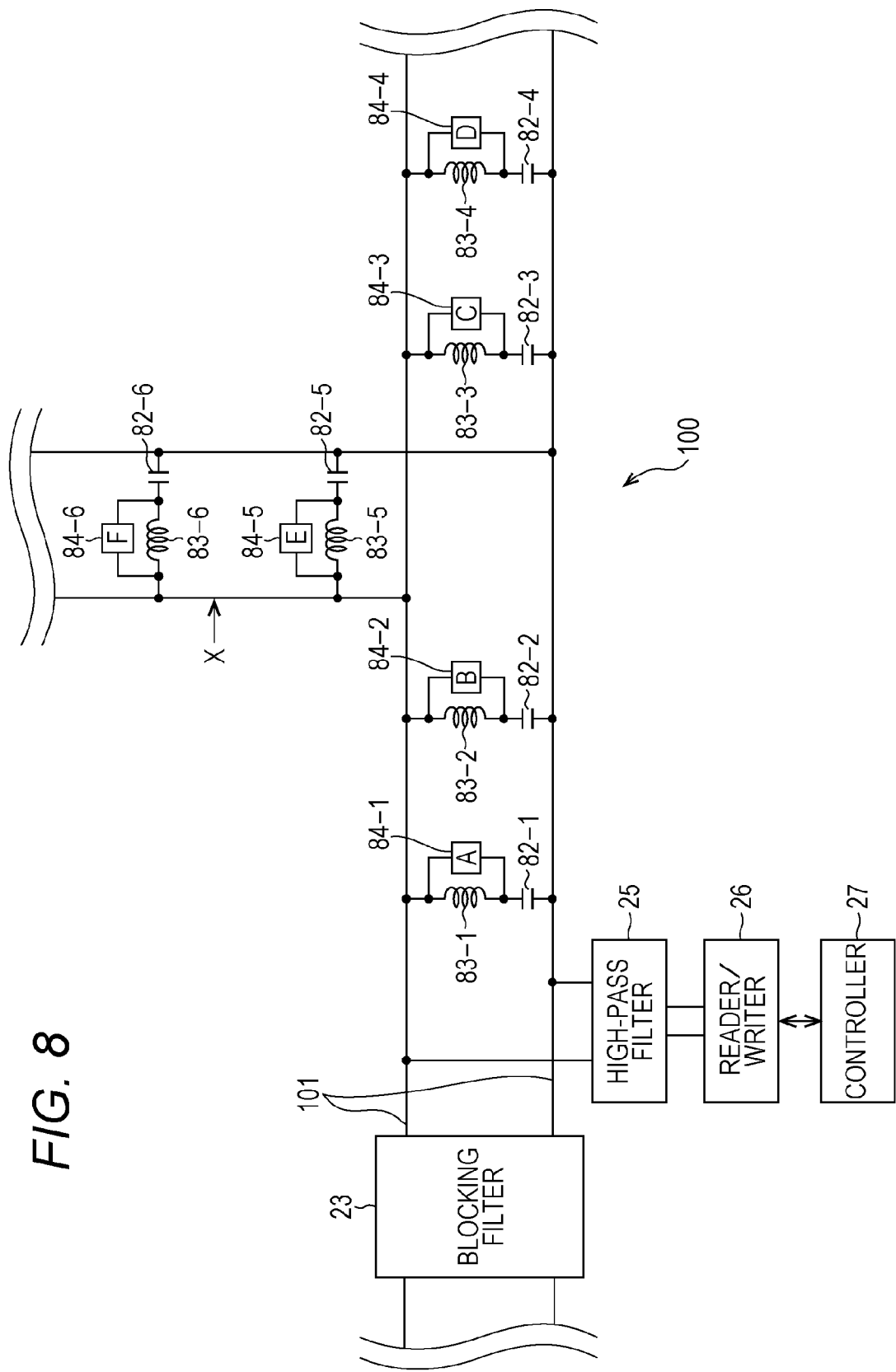
FIG. 8 is a block diagram showing a configuration example of a power line disconnection detection system to be a second embodiment.

FIG. 8 shows a configuration example of a power line disconnection detection system to be a second embodiment. A power line disconnection detection system 100 detects a disconnection place of power lines provided in a building and the like to feed alternating-current power from a commercial alternating-current power supply.

The power line disconnection detection system 100 includes a blocking filter 23, a high-pass filter 25, a reader/writer 26, and a controller 27 provided on power lines 101 and capacitors 82-$i$, coils 83-$i$, and IC chips 84-$i$ provided on a plurality of places of the power lines 101. In the case of FIG. 8, $i=1, 2, 3, 4, 5$, and 6 is satisfied. These components are the same as the components of the table tap 20 described above and are denoted by the same reference numerals.

The blocking filter 23 is provided in an end of a detection range of the disconnection place. The blocking filter 23 prevents the alternating-current signal communicated through the power lines 101 from being output out of a disconnection range and prevents alternating-current signal noise from being input from another power line disconnection detection system 100 (for example, the power line disconnection detection system provided in a neighboring room).

The high-pass filter 25 prevents the alternating-current power from being input to the reader/writer 26 and the controller 27, while passing the alternating-current signal communicated through the power lines 101 between the reader/writer 26 and the IC chip 84-*i*. The reader/writer 26 regularly transmits a command with respect to the IC chip 84-*i* by an alternating-current signal using the power lines 101, acquires identification information returned from the IC chip 84-*i* according to the command, and notifies the controller 27 of the identification information.

The controller 27 manages an arrangement place of the IC chip 84-*i* and device information thereof and detects the disconnection place on the power lines 101, on the basis of the identification information of the IC chip 84-*i* on the power lines 101, which is notified by the reader/writer 26. The alternating-current power that functions as the driving power is fed to the high-pass filter 25, the reader/writer 26, and the controller 27 by power lines not shown in the drawings.

The capacitor 82-*i* and the coil 83-*i* are arranged in series to the positive and negative power lines 101 and the IC chip 84-*i* is provided in parallel to the coil 83-*i*.

The IC chip 84-*i* returns the identification information stored therein, when the IC chip receives the command transmitted as the alternating-current signal by the reader/writer 26, through the power lines 101. In the case of FIG. 8, it is assumed that IC chips 84-1 to 84-6 store identification information A to F, respectively.

[Description of Operation of Power Line Disconnection Detection System 100]

In the power line disconnection detection system 100, the command is regularly transmitted from the reader/writer 26 through the power lines 101 and each of the IC chips 84-*i* returns each identification information according to the command. Therefore, when disconnection is not generated on the power lines 101, the controller 27 is regularly notified of the identification information returned from all of the IC chips 84-*i*.

Meanwhile, when the disconnection is generated on the power lines 101, the controller 27 is not notified of the identification information of the IC chip 84-*i* that is disposed at a rear step of the disconnection place, as viewed from the side of the reader/writer 26. Therefore, the controller 27 specifies the disconnection place on the basis of the identification information that is not notified.

For example, when a place shown by X in FIG. 8 is disconnected, the controller 27 is notified of the identification information A, B, C, D, and E and is not notified of the identification information F. Therefore, the controller 27 can specify the disconnection place as a portion between the IC chip 84-5 and the IC chip 84-6.

In an example of FIG. 8, the number of IC chips 84-*i* is 6. However, because the IC chips 84-*i* can be manufactured small at a low cost and do not consume the alternating-current power supplied from the commercial alternating-current power supply, the number of IC chips 84-*i* in the power line disconnection detection system 100 can be easily increased. If the number of IC chips 84-*i* is increased and an arrangement interval thereof is narrowed, the disconnection place can be precisely specified.

The power line disconnection detection system 100 can be applied to detection of the disconnection of all communication lines in addition to the power lines.

Embodiments of the present invention are not limited to the embodiments described above and various changes can be made without departing from the gist of the present invention.

REFERENCE SIGNS LIST

10 Electronic device, 11 Outlet plug, 12 Low-pass filter, 14 High-pass filter, 15 Voltage generating unit, 16 IC chip, 21 Power meter, 22 Switch, 23 Blocking filter, 24 Outlet, 25 High-pass filter, 26 Reader/writer, 27 Controller, 31 Switch, 32 LED, 81 Storage unit, 84 IC chip, 100 Power line disconnection system

The invention claimed is:

1. A detecting device comprising:
    a plurality of first storage elements, each of which is disposed on power lines, configured to generate driving power on the basis of an alternating-current signal communicated through the power lines, load-modulate the alternating-current signal communicated through the power lines, and output stored first identification information of a plurality of outlets through the power lines;
    a communication unit configured to receive the first identification information of the plurality of outlets output by the plurality of first storage elements through the power lines; and
    a detecting unit configured to detect, on the basis of the received first identification information of the plurality of outlets, whether an electronic device is connected to or disconnected from the power lines.

2. The detecting device according to claim 1, further comprising:
    a blocking unit, provided on the power lines, configured to block an input/output of the alternating-current signal.

3. The detecting device according to claim 1, further comprising:
    the plurality of outlets, each of which feeds power to the electronic device,
    wherein each of the plurality of first storage elements is connected in parallel to one of positive and negative sides of the power lines connected to the plurality of outlets and is configured to output the stored first identification information of a corresponding outlet of the plurality of outlets through the power lines, in an event the electronic device is connected to the corresponding outlet and the power lines become a closed circuit, and
    the detecting unit is configured to detect that the electronic device is connected to the outlet, on the basis of reception of the first identification information.

4. The detecting device according to claim 3,
    wherein the communication unit is configured to receive second identification information output by a second storage element, wherein the second storage element is incorporated in the electronic device connected to the power lines and is configured equally to one of the plurality of first storage elements, through the power lines, and
    the detecting unit is configured to associate the received first identification information and second identification information with each other and manage an association information.

5. The detecting device according to claim 1, further comprising:
    a switching unit configured to perform switching such that one of the plurality of first storage elements, corresponding to one of the plurality of outlets, is connected to the communication unit.

6. The detecting device according to claim 1,
wherein the detecting unit is configured to detect change in states of the power lines on the basis of the received first identification information of the plurality of outlets and a providing unit is configured to provide the change in the states of the power lines detected by the detecting unit to a user.

7. The detecting device according to claim 1,
wherein each of the plurality of first storage elements is connected to positive and negative sides of the power lines and regularly outputs the stored first identification information of a corresponding outlet of the plurality of outlets through the power lines, and the detecting unit is configured to detect that the disconnection is generated in the power lines, on the basis of non-reception of the first identification information.

8. A detecting method comprising:
receiving a first identification information of a plurality of outlets, wherein the first identification information is output by a plurality of first storage elements through power lines, wherein each of the plurality of first storage elements is disposed on the power lines; and detecting, on the basis of the received first identification information of the plurality of outlets, whether an electronic device is connected to or disconnected from the power lines.

\* \* \* \* \*